United States Patent [19]

Leuchs et al.

[11] Patent Number: 5,124,994
[45] Date of Patent: Jun. 23, 1992

[54] LIGHT GENERATING DEVICE

[75] Inventors: Gerhard Leuchs, Azmoos; René Lazecki, Buchs, both of Switzerland

[73] Assignee: Werner Tabarelli, Schaan, Liechtenstein

[21] Appl. No.: 623,397
[22] PCT Filed: Mar. 15, 1990
[86] PCT No.: PCT/EP90/00424
§ 371 Date: Jan. 22, 1991
§ 102(e) Date: Jan. 22, 1991
[87] PCT Pub. No.: WO90/11485
PCT Pub. Date: Oct. 4, 1990

[30] Foreign Application Priority Data

Mar. 21, 1989 [AT] Austria .................. A 651/89

[51] Int. Cl.⁵ .................................... H01S 3/13
[52] U.S. Cl. ........................ 372/32; 372/19; 372/20; 372/29; 372/97
[58] Field of Search ............ 372/20, 32, 29, 19, 372/97

[56] References Cited

U.S. PATENT DOCUMENTS

| 4,221,472 | 9/1980 | Smith et al. | 372/31 |
| 4,677,630 | 6/1987 | Fujita et al. | 372/50 |
| 4,839,614 | 6/1989 | Mill et al. | 372/32 |
| 4,907,237 | 3/1990 | Dahmani et al. | 372/32 |
| 4,914,662 | 4/1990 | Nakatani et al. | 372/29 |
| 4,977,564 | 12/1990 | Ryu et al. | 372/29 |
| 4,979,178 | 12/1990 | Beausoleil et al. | 372/20 |

FOREIGN PATENT DOCUMENTS

| 2945219 | 5/1981 | Fed. Rep. of Germany . |
| 3637649 | 2/1988 | Fed. Rep. of Germany . |
| 3706635 | 9/1988 | Fed. Rep. of Germany . |
| 2154787 | 9/1985 | United Kingdom . |

OTHER PUBLICATIONS

Article in "Wissensspeicher Lasertechnik", VEB, Fachbuchverlag Leipzip, 1987 pp. 417–420.
Article in the book "Laser" by Knenbuhl and Sirgrist; Verlag Teubner, Stuttgart, 1988, pp. 190–193.

Primary Examiner—Georgia Y. Epps
Attorney, Agent, or Firm—Lorusso & Loud

[57] ABSTRACT

The invention concerns a device for generating light, in particular light for use in length measurement using an interferometer. The frequency of the laser light emitted is controlled as a function of the wavelength in the surrounding gaseous medium (air) in such a way that the wavelength in the air remains constant. The light source in this device is a laser diode. Located external to the laser resonator is a device for feeding back to the resonator, at selected frequencies, light emitted by the laser diode.

23 Claims, 3 Drawing Sheets

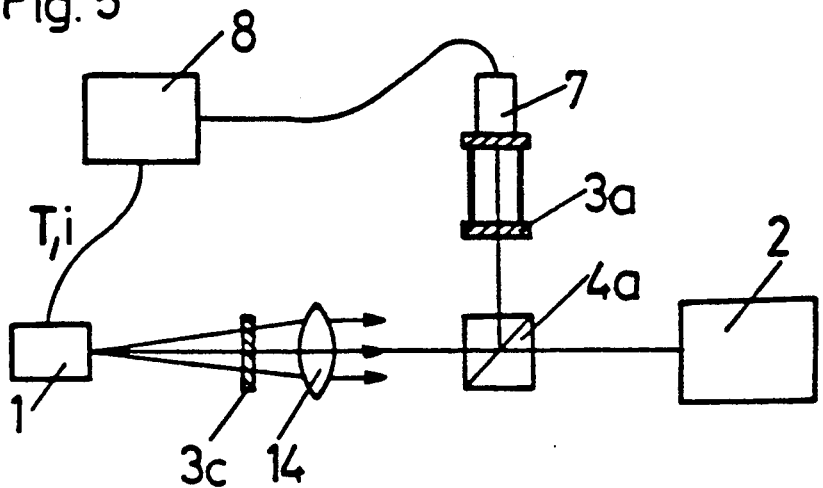
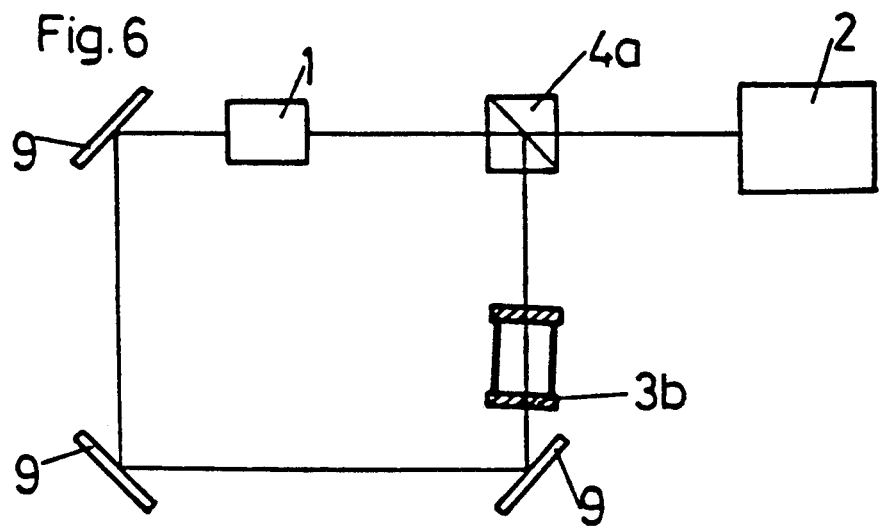
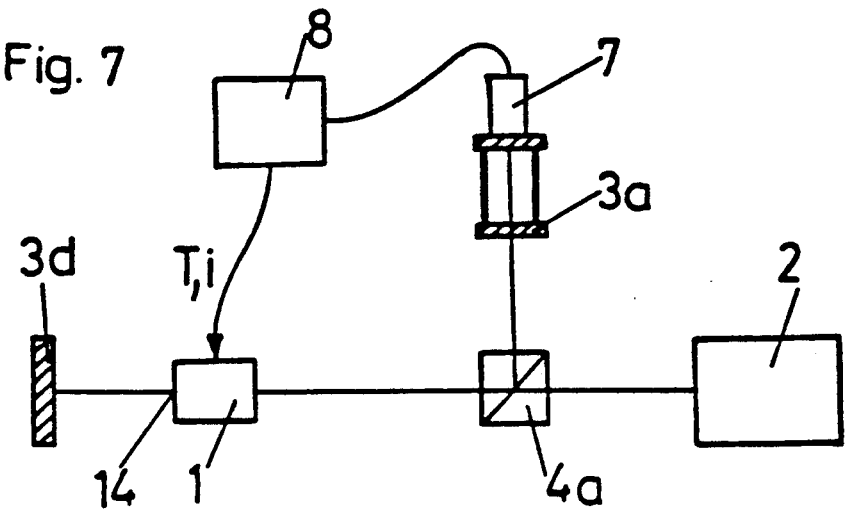

LIGHT GENERATING DEVICE

BACKGROUND OF THE INVENTION

The invention concerns a device for generating light, in particular light for use in length measurement using an interferometer. The frequency of the laser light emitted is controlled as a function of the wavelength in the surrounding gaseous medium (air) in such a way that the wave length in air remains constant.

With interferomic determination of displacement of a mobile component, it is of decided meaning to precisely know the wavelength of the employed laser light in the surrounding medium (henceforth called wavelength in air), since the displacement path exists in units of the wavelength in air. If one knows the exact frequency of the light wave beforehand, the possibility arises to determine the wavelength in air through an ascertainment of the refractive index.

The refractive index can be determined using the "parameter method"-the temperature, air pressure, and air moisture are measured and the index is formulmericly calculated. However, this parameter procedure has the disadvantage that important influences such as the composition of gas are not incorporated and thus eliminates possible operation of the interferometer in the workshop or open areas.

A device is already known where the wavelength in air is measured by an open etalon and the frequency of the light source is adjusted as a function of the refractive index of air, in such a way that the wave length in air for interferomic measurement remains constant. In this device, a Helium-Neon-Laser is employed as the light source. The variation of the emitted laser light's frequency is possible through adjustment of the laser resonator's length by means of warming and cooling or through utilization of the "Piezo-Effect."

Apart from a relatively high required power supply and size of a Helium-Neon-Laser a particular disadvantage appears that the range of frequency adjustability merely suffices for determining fluctuations in the refractive index in the magnitude of $\Delta n \approx 2.10_{-6}$, while in practice the resulting fluctuations are far higher, namely in the range $\Delta n \approx 10_{-4}$.

The object of the invention is to provide a device for generating light, in particular light for use in length measurement using an interferometer, that is able to hold the wavelength constant in the surrounding medium through steady changes in frequency with the existing fluctuations in the refractive index (magnitude of $\Delta n \approx 10^{-4}$). In addition, the device should present a compact model, in particular a small light source and if need be, the possibility of battery operation.

According to the invention, this is accomplished by the fact that the light source is a laser diode and a device is provided external to the laser resonator, for feeding back to the resonator, at selected frequencies, light emitted by the laser diode.

With the feeding back of the laser light at selected frequencies according to the invention's device, it is possible, within certain limits, to "lock" the emissions-frequency of the laser diode's light to the preferred feedback frequency, when alterations of the wave length in air or the refractive index in the surrounding medium occur, in such a way that the wavelength in air actually remains constant, whereby by this procedure the otherwise typically unsteady (discontinuous) behavior of the emission-frequency of the laser diode as a function of the operative parameters (injection current, temperature) can be avoided within a certain "locking range."

With this "locking" of the laserdiode's emission-frequency within a range of control, the device utilizes the known effect that feedback light at selected frequencies amplifies the corresponding emission-frequency-mode of the laserdiode or represses the unwanted build-up of other modes, in such a way that it is even possible to "lock" the emitted light of the laser diode to each frequency that corresponds to the preferred feedback frequency from the frequency selective feedback device.

The frequency selectivity of a feed back device can then be obtained according to a preferred embodiment, by an etalon of given length which is operated either in transmission or reflection, the surrounding medium being present between the reflective surfaces of the etalon, whereby at least a part of the laser light being frequency-selected by the etalon is fed back to the laser resonator of the laser diode. With regard to said "locking effect" a narrow-banded feed back from an etalon operated in transmission is particularly advantageous. With this embodiment, said preferred feedback frequency from the etalon in the range of the emission-frequency of the laser diode varies automatically as a function of the refractive index in the surrounding medium in such a way, that with the illustrated effect, the emission-frequency of the laser diode adjusts itself so that the wave length in air remains constant.

If one knows the wavelength in air or the refractive index of the surrounding medium (e.g. through electronic analysis of interference-rings in an open air-wave length-determination etalon), it is in principle also possible to adjust the feedback frequency in the laser diode and with it the "locked" emission-frequency of the laser diode, by varying, as a function of the refractive index or the wavelength, (e.g. piezo-electrically or electro-optically) the length of a closed etalon of the feed back device or the distance of this etalon from the laser diode.

According to a favorable embodiment of the invention, it is desirable if an electronic control device is provided that controls the injection current and/or the temperature of the laser diode as a function of the wavelength in air or refraction index of the surrounding medium.

At the start of a measurement series, the controlling device is first used for determining a suitable initial emission-frequency of the laser diode by applying a defined injection current and/or temperature. Starting from this emission-frequency, a frequency control keeps the wavelength in air constant even if the environmental conditions (refractive index) change. The criteria for these initial selections are a possible low energy consumption for the maintenance of the chosen operative parameters, as well as a possibly important distance between two adjacent mode-jumps, in the emission-frequency-spectrum of the laser diode as a function of the injection current and temperature.

The determination of the existing wavelength or the refraction index in the surrounding medium, which is necessary for the electronic control, may be accomplished by an etalon, the surrounding medium being present between the mirrored surfaces of the etalon and whose interference pattern is electronically evaluated. According to the mentioned arrangement of initial conditions, the possibility arises with the electronic controlling device (actual control function) to control the operative parameters (injection current, temperature) of the laser diode as a function of the wavelength in air thereby assisting the "locking" of the laser diode's emission-frequency to the preferred frequency from the feedback device. Through this combination of optical feed back regulation on one side and electronic regulation of the operative parameters on the other side, it follows that the emission-frequency remains "locked" over a large "locking range" to the preferred feedback frequency.

In this case no high claims are placed upon the accuracy of electronic regulation, since emission-frequency, which is necessary to hold the wavelength in air constant; within the "locking range" is determined by the signal from the feedback device.

If the laser diode frequency, based on a relatively wide-banded feed back at selected frequencies (e.g. from a solid glass etalon of small thickness) is not "locked", or at least not sufficiently "locked" to a specific optical feedback frequency, the control of the emission-frequency of the laser diode is also possible exclusively by means of the electronic controlling device as a function of the wave length in air or the refraction index in the surrounding medium. Thus a high accuracy claim is placed upon the electronic regulating control device.

In this case, said optical feed back effect is realized with the goal that feedback light amplifies the actual oscillating frequency-mode and simultaneously represses the build-up of adjacent modes. In this manner, the typically unsteady behavior of the emission-frequency of laser diodes can be avoided within the required range of control. Such an unsteady behavior would severely disturb the function of the device according to the invention.

Particularly in the context with multi-mode laser diodes, a two-stage procedure is also possible: at first by means of an etalon, not necessarily filled with surrounding medium, perhaps a solid glass etalon, that is preferably thinner than the length of the laser diode's laser resonator, light is optically fed back at selected frequencies, for the amplification of the actual oscillating modes or the repressing of the adjacent mode build-up; in a second stage (from a longer etalon) light is then fed back at that frequency, that should lead to the "locking".

The feedback effect also depends on the positioning of the etalon or a mirrored surface of the feedback device from the laser diode's laser resonator. This can be employed in order to control the preferred fed back frequency by controlling the distance of the etalon or the mirrored surface from the laser diode.

Further advantages and details will be illustrated in the following description of the drawings.

BRIEF DESCRIPTION OF THE DRAWINGS

FIGS. 4 and 5 show further examples, by which an electronic control is provided for controlling the operative parameters of the laser diode as a function of the surrounding conditions.

FIGS. 6–8 are embodiments where light is fed back to a second output of the laser diode.

DETAILED DESCRIPTION OF THE INVENTION

Figure 1:
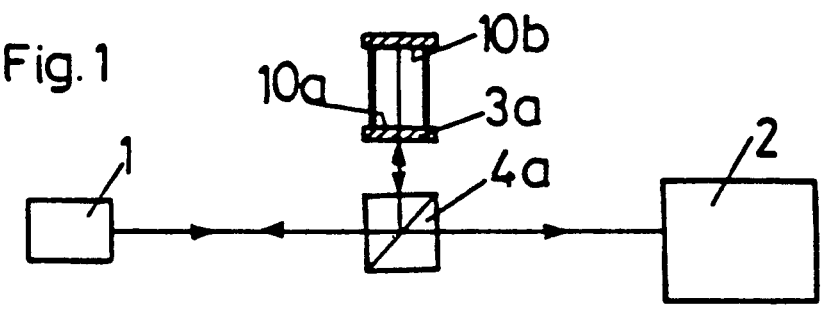
FIGS. 1 through 3 schematically represent embodiments of the invention's device, where the control of the emission-frequency of a laser diode occurs solely by optical feedback.

The device for generating light, as shown in FIG. 1 comprises a laser diode 1, a beam splitter 4a, and an air-gap-etalon (Fabry-Perot-Interferometer) 3a, and supplies light to the interferometer for distance measurement which is referenced by 2, whose frequency is controlled as function of the wavelength existing in the surrounding gaseous medium, so that the wave length in air remains constant. The actual construction of the interferometer 2 can vary according to application need. For example, the interferometer can present a beam splitter, where the light from the invention's device is divided into a measuring path and a reference path. The measuring path, whose length varies, leads through the surrounding medium and is thus susceptible to the environmental influence. The respective beams from the reference and measuring sections are brought to the interferometer and the interference signal is evaluated. Through the constant holding of the wave length in the surrounding medium (air), it is guaranteed that the results of measurement, which at first are in units of the wave length in air, are also correctly known in metric units.

According to the embodiment of FIG. 1, the frequency-selective feedback unit essentially consists of the open etalon 3a, that is operated in reflection and presents a mirrored space in the millimeter range. With such open etalons, the surrounding medium (generally air) is comprised between the reflective surfaces 10a and 10b. By changing the refractive index of the surrounding medium and with it the wave length in air, the preferred feedback frequency from the etalon 3a, which is fed to the laser diode 1 through the splitter 4a, also changes.

If the laser diode's emission frequency is locked (e.g. through sufficiently strong and narrow-banded feed back) to the feedback frequency, it is thus possible, to "pull along" the laser diode's emission-frequency with the feedback frequency, within a certain range of control.

Thereby the adjustment of the frequency results directly from the open etalon 3a in such a way that the wave length in air remains constant. In practice, one will possibly arrange the open etalon 3a in the proximity of the measuring section of the interferometer 2 or in other ways which guarantee that the environmental conditions in the measuring section correspond to those in the etalon 3a.

Figure 2:
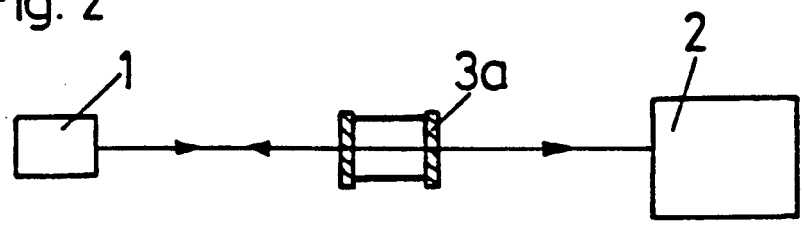

FIG. 2 shows an embodiment that barely differs from that in FIG. 1 with regard to the feeding back from an open etalon operated in reflection. However, as represented in FIG. 2, the light for the interferometer passes through the etalon 3a. With the embodiment represented in FIG. 3, the feeding back, at selected frequencies, of light emitted from the laser diode 1 into the laser resonator occurs by means of an open etalon 3b which is operated in transmission, and whose mirrored surfaces 12a, 12b comprise the surrounding medium. The light emitted from the laser diode can be guided in glass fibers 6, via a beam splitter (glass-fiber-coupler) 4b, a part of the light gets into the measuring interferometer 2 and another part of the light goes through the output lens 5 into the etalon 3b in transmission. The light, which varies in its preferred feedback frequency by means of the etalon 3b as a function of the wavelength or the refractive index existing in ambient medium, is coupled through the lens 5 into a glass fiber 13 and from there is sent back through the glass-fiber-coupler 4b to the laser resonator. Through the slight tilting of the etalon 3b with respect to the direction of light between the two lenses 5, one avoids feedback of the reflected signal.

With etalons operated in transmission, a particularly narrow-banded feedback to the laser diode 1 is possible, where the feedback light, at selected frequencies, amplifies the corresponding emission-frequency-mode and effectively represses the unwanted creation of secondary modes in such a way that a locking of the emission-frequency of the laser diode to the preferred feedback frequency from the etalon 3b is exactly ensured.

Figure 3:
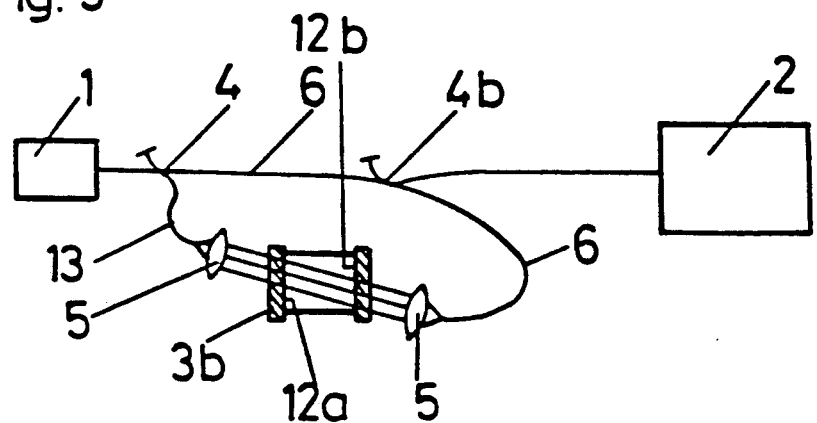

In FIGS. 1 through 3, the preferred feedback frequency by the construction of the etalons 3a and 3b which is open to the surrounding medium, automatically adjusts exactly so that the wavelength in air remains constant.

If the wavelength in air or the refractive index is known, one can undertake an active adjustment of the preferred feedback frequency, to which the laserdiode's emission-frequency is locked. This is possible, for example with a piezo-electrically or electro-optically length-adjustable etalon or by a variation of the distance of the etalon (or a mirror surface facing the laser diode) from the laser diode.

Figure 4:
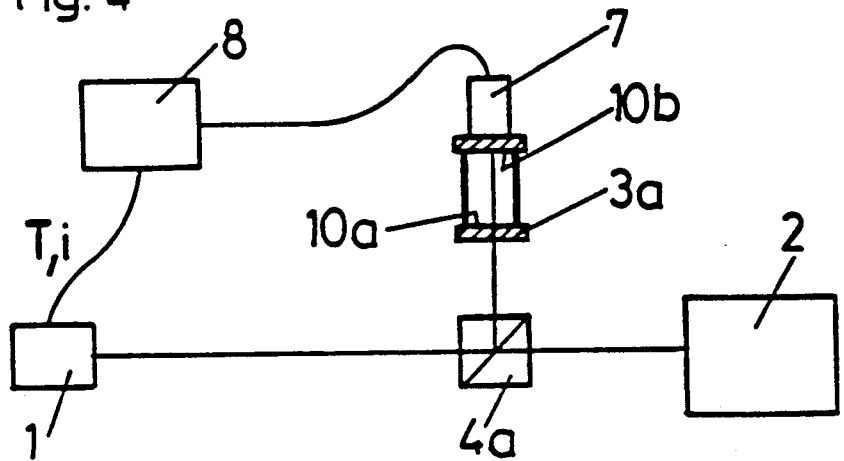
Figure 8:
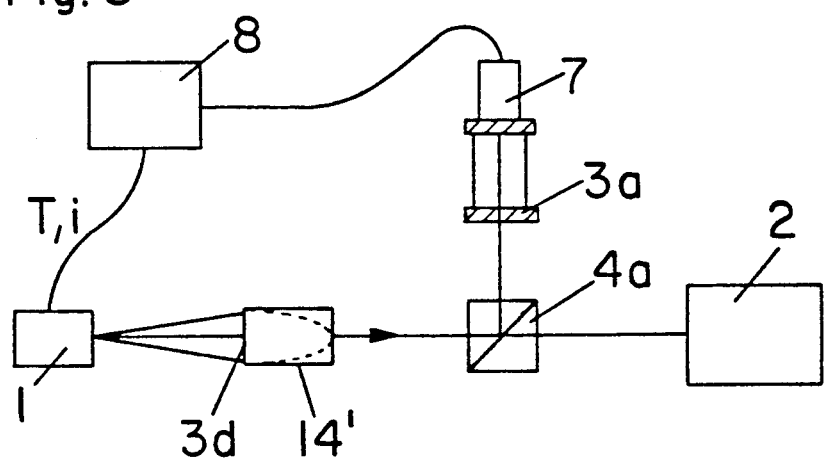

With the embodiment of FIG. 4, in addition to the frequency-selective feedback from the etalon 3a into the laser resonator of the laser diode 1, there is provided a electronic control device 8 that controls the injection current i and/or the temperature T of the laserdiode as a function of the wavelength or the refractive index in the ambient medium. For determination of the wavelength existing in the ambient medium, an etalon can be provided, between the mirrored surfaces of which the ambient medium is present and whose interference pattern is determined and electronically evaluated by a position-sensitive detector, preferably a double or quadrant diode 7. FIG. 4 also shows that the etalon for determination of the environmental parameters for the electronic control device 8 and the etalon of the feedback device are the same etalon 3a.

If the laserdiode's emission-frequency "locks" to the optical feedback frequency by effective feeding back, no high claims are placed on the accuracy of electronic control. Through a combination of feedback control on one side and electronic control of the operative parameters of the laser diode on the other, the emission-frequency remains "locked" over a large "coupling range" to the preferred optical feedback frequency. In this case, the electronic control 8 is used to guarantee the "coupling" of the laserdiode's emission-frequency with the frequency from the feed back device. In addition, this allows such a control device to be used as a controller at the onset of a measurement series for securing the initial emission-frequency of the laserdiode which is resultant from the constant holding of the wavelength in air.

If the laserdiode's frequency based on a relatively wide-banded optical feed back does not "lock" or does not lock sufficiently to a set optically feedback frequency, it is thus possible with precise electronic regulation to direct the control of the emission-frequency of the laserdiode exclusively with the electronic regulation device as a function of the wavelength in air or the refractive index. In this case, the desired effect of the optical feedback is utilized with the intention that the feedback light amplifies to the actual oscillating frequency mode of the laserdiode, and thus simultaneously represses the oscillation of adjacent modes. Thereby the usually unsteady behavior of the emission-frequency of laserdiode within a required range of control is avoided.

In order to repress the oscillation of adjacent modes, a solid glass etalon 3c can be provided (for relatively wide-banded feed back at selected frequencies) whose thickness is smaller than the length of the laser resonator, as is shown in FIG. 5. In order to be unsensitive to the etalon incline, the parallel-plane solid glass etalon 3c is arranged near the laserdiode within the divergent light beam emitted by the laser diode 1 before this beam reaches a collimation optic 14 or a coupling device into a glass fiber.

The distance, lying in the range of the resonator length and below, of the glass etalon 3c from the laserdiode 1 (and with it of the mirrored surfaces of the glass etalon which faces the laser diode 1) can be adjustable, whereby the desired feedback frequency is adjustable if need be. Instead of the glass etalon 3c, such a spatially variable mirrored surface near the laser diode could have also be formed by the entry-surface of a collimation or optical focussing system (e.g. for the coupling into a glass fiber).

FIG. 6 shows an embodiment as essentially represented in FIG. 3, where a slightly inclined open etalon 3b operated in transmission is provided. However in FIG. 6, the light transmitted by the etalon in a frequency-selective manner as a function of the surrounding conditions (wave length or refractive index) is fed back through the mirror 9 into a second output of the laserdiode.

FIG. 7 is a variation from that in FIG. 5, where instead of the employed solid glass etalon 3c, a mirror 3d is provided at a distance from the second output of the resonator 14 of the laserdiode 1. The mirror 3d can also be a glass-plate etalon.

The invention is not limited to the represented embodiments. Particularly, with multi-mode-laserdiodes emitting visible light, a two-staged optical feed back is also possible. Thereby at first by means of an etalon not necessarily filled with the ambient medium, perhaps a solid glass etalon, that is preferably thinner than the length of the laser resonator, light for amplifying to the actual by oscillating mode and for repressing the adjacent modes, is optically fed back at selected frequencies. (1st stage) From a second etalon, relatively narrow-banded light is then returned, that should lead to "coupling" or "locking" of the laserdiode's emission-frequency. (2nd stage)

In order to obtain an automatic "co-control" of the etalon's length or the distance of a mirrored surface to the laserdiode, as well as the desired feedback frequency with the laserdiode's temperature, provisions can be made according to a preferred embodiment so that the laserdiode and the etalon or the reflective surface of the feed back device are thermally "coupled" and thus preferably possess the equal temperature.

We claim:

1. A device for generating light, in particular light for interferomic measurement of length, whereby the frequency of the emitted laser light is controlled as a function of the wavelength existing in an ambient gaseous medium so that the wave length in the ambient gaseous medium remains constant, characterized in that the light source is a laser diode, and that means (or a device) is provided external to the laser resonator for a frequency-selective feedback of light emitted by the laser diode into the resonator.

2. The device according to claim 1, characterized in that the preferred feedback frequency from the optical feed back device varies within the range of the laser diode's emission-frequency as a function of the wavelength or refractive index existing in the ambient medium.

3. The device according to claim 2, characterized in that the feed back device comprises an etalon of fixed total length between the mirrored surfaces of which the ambient medium is present, whereby at least a part of the emitted light, at selected frequencies, from the etalon is fed back to the laser resonator.

4. The device according to claim 3 characterized in that the etalon is operated in transmission.

5. The device according to claim 2, characterized in that the feedback device comprises an etalon of a length which is adjustable as a function of the wavelength or refractive index in the ambient gaseous medium, whereby by adjusting the length, the preferred feedback frequency of the light fed back to the laser diode is also adjusted.

6. The device according to claim 2, characterized in that the adjustable length etalon is a plane-parallel plate made of electro-optical material whose top surfaces are provided with electrically conductive, semi-transparent coating so that the optical thickness of the etalon is adjustable by applying an electrical voltage.

7. The device according to claim 1, characterized in that the feed back device comprises a mirrored surface, which preferably lies at a distance from the laser resonator which is within the magnitude of the laser resonator's length or even smaller.

8. The device according to claim 7, characterized that the entry surface of an optical system required for collimating and focussing, preferably of a gradient index lens, is used as said mirrored surface.

9. The device according to claim 1, characterized in that the feed back device comprises an etalon whose distance from the laser diode is variable, the distance being within the magnitude of the laser resonator length and even below.

10. A device according claim 7, characterized in that an etalon is a thin small plate made of transparent material, preferably glass, whose surface facing the laser diode forms said mirrored surface and whose thickness is smaller than the length of the laser resonator.

11. The device according to claim 1, characterized in that an electronic control means is provided for controlling the injection current and/or the temperature of the laser diode as a function of the wavelength or refractive index in the ambient medium.

12. The device according to claim 11, characterized in that the control of the laser diode's emission-frequency as a function of the wavelength or refractive index in the ambient medium is solely effected by the electronic control means.

13. The device according to claim 11, characterized in that an etalon is provided for determination of the wavelength in the ambient medium, the ambient medium being comprised between the mirrored surfaces of the etalon and the interference pattern being determined and electronically evaluated.

14. The device according to claim 3, characterized in that the etalon for the optical feed back device is also used for determination of the existing wavelength in the medium for an electronic control means.

15. The device according to claim 1, characterized in that the feedback device comprises at least two different length etalons or an etalon and an additional reflective surface, from which light is fed back to the laser diode at selected frequencies.

16. The device according to claim 1, characterized in that the optical feedback device comprises an etalon preferably operated in reflection, whose length is smaller than the laser resonator length.

17. The device according to claim 16, characterized in that the etalon is a thin plane-parallel plate made of transparent material, preferably glass, whose thickness is less than the resonator's length and which is arranged within the divergent light beam from the laser diode.

18. The device according to claim 1, characterized in that a laser diode emitting visible light is used as the light source.

19. A device according to claim 1, characterized in that a multi-mode-laser diode is used as the light source which through the feeding back at selected frequencies emits solely one mode.

20. The device according to claim 1, characterized in that the laser diode and the etalon or the etalons or reflective surfaces of a feed back device are thermally coupled.

21. The device according to claim 1 characterized in that light emitted by the laser diode through a first resonator mirrors is fed back by means of the feedback device to a second resonator mirror in the laser resonator.

22. A device according to claim 9, characterized in that the etalon is a thin small plate made of transparent material, preferably glass, whose surface facing the laser diode forms a mirrored surface and whose thickness is smaller than the length of the laser resonator.

23. The device according to claim 13, characterized in that the etalon for the optical feed back device is also used for determination of the existing wavelength in the medium for the electronic control means.

* * * * *